United States Patent [19]
Goesele et al.

[11] Patent Number: 4,907,056
[45] Date of Patent: Mar. 6, 1990

[54] SEMICONDUCTOR COMPONENT COMPRISING A PLANAR PN-JUNCTION

[75] Inventors: Ulrich Goesele, Leinfelden-Echterdingen; Reinhard Stengl, Stadtbergen, both of Fed. Rep. of Germany

[73] Assignee: Siemens Aktiengesellschaft, Berlin and Munich, Fed. Rep. of Germany

[21] Appl. No.: 248,150

[22] Filed: Sep. 23, 1988

[30] Foreign Application Priority Data

Oct. 8, 1987 [DE] Fed. Rep. of Germany ....... 3734087

[51] Int. Cl.$^4$ .......................................... H01L 21/265
[52] U.S. Cl. ........................................ 357/38; 357/52; 357/53; 357/13; 357/35
[58] Field of Search ................... 357/38, 52, 13, 35, 357/53

[56] References Cited

U.S. PATENT DOCUMENTS 4,672,738 6/1987 Stengl .................................. 29/576
4,740,477 4/1988 Einthoven .............................. 437/8

FOREIGN PATENT DOCUMENTS 0088967 9/1983 European Pat. Off. .

Primary Examiner—Andrew J. James
Assistant Examiner—David Soltz
Attorney, Agent, or Firm—Hill, Van Santen, Steadman & Simpson

[57] ABSTRACT

A semiconductor region that is inserted into a semiconductor member is provided, the latter being separated from the former by a planar pn junction including a first, more highly doped sub-region and a second, more lightly doped sub-region that is limited by a part of the pn junction that gradually approaches a boundary surface of the semiconductor member. An electrode contacts the semiconductor region and covers a part of the second sub-region and extends toward the lateral limitation of the semiconductor region to such an extent that, given the application of a voltage inhibiting the pn junction the space charge zone forming thereat has its edge lying in the boundary surface just reaching the electrode edge given a reduced breakdown voltage.

17 Claims, 2 Drawing Sheets

SEMICONDUCTOR COMPONENT COMPRISING A PLANAR PN-JUNCTION

BACKGROUND OF THE INVENTION

The present invention is directed to a semiconductor component comprising a planar pn junction Such a component can be derived, for example, from European Patent Application No. EP-A-0 176 778. When a sufficiently high voltage, referred to as the breakdown voltage, is supplied via the electrodes and inhibiting the pn junction a local breakdown of the pn junction ensues. This causes a thermal overload and, thus, a destruction of the semiconductor component very frequently occurs. The local breakdown in this known component proceeds approximately in the area where a part of the pn junction, extending parallel to a boundary surface of the semiconductor member, merges into the part of the pn junction that gradually approachs the boundary surface.

The local breakdown of the pn junction is also of great significance in power thyristors. Power thyristors are composed of a semiconductor member having four semiconductor layers of alternating conductivity types adjacent to one another. The four semiconductor layers are: an n-emitter; a p-base; an n-base; and a p-emitter. When the voltage, that is applied between a terminal at the cathode side and a terminal at the anode side that blocks the thyristor, is elevated to the value of the breakdown voltage, then a local breakdown of the pn junction proceeds that separates the p-base from the n-base and proceeds roughly parallel to a boundary surface of the semiconductor member. In general, the breakdown occurs at that edge of this pn junction lying in a lateral surface of the thyristor.

In order to avoid such an uncontrollable, local breakdown, that frequently leads to the destruction of the thyristor, European Patent Application No. EP-A-0 088 967 discloses the irradiation, with a laser beam, of the pn junction between the p-base and n-base under the central ignition electrode of the thyristor. This provides it with a bellying that diminishes the thickness of the n-base layer and initiates a controllable breakdown at a reduced breakdown voltage that occurs in the region of the bellying. This controllable breakdown leads to a precipitous ignition of the thyristor whereat a thermal destruction does not occur because of the use of a reduced breakdown voltage. The method, however, suffers the disadvantage that the reduced breakdown voltage can not be set at a defined voltage value with sufficiently desired precision and reproducibility.

SUMMARY OF THE INVENTION

The present invention provides a semiconductor component wherein the pn junction breaks down in a defined way when a reduced breakdown voltage, that can be set in a simple way, is attained, without a thermal destruction of the component occurring.

To this end, a semiconductor component is provided comprising a planar pn junction whereby a semiconductor region having a second conductivity type is provided at a boundary surface of a doped semiconductor member having a first conductivity type. A first sub-region of the semiconductor region is bounded by a part of the pn junction that extends substanially parallel to the boundary surface. A second subregion is separated from the remaining part of the semiconductor member by a part of the pn junction that approaches the boundary surface and laterally limits the semiconductor region in the boundary surface. The doping concentration of the second sub-region is such that it is lower than that of the first sub-region. The semiconductor region and the semiconductor member are each respectively contacted by a first and second electrode. The edge of the first electrode contacts the second sub-region and this edge is brought toward the lateral limitation of the semiconductor region that lies in the boundary surface to such an extent that, given the application of a voltage inhibiting the pn junction, the space charge zone being formed at the pn junction has its edge lying in the boundary surface just approaching the first electrode, given a reduced breakdown voltage.

In an embodiment, the doping concentration of the second sub-region decreases from a doping concentration approximately equal to that present at the boundary of the first region in a direction toward the lateral limitation of the semiconductor region.

In an embodiment, the semiconductor region is composed of a first base layer of a thyristor and the semiconductor member is formed of a second base layer and of a second emitter adjacent thereto in the thyristor. A first emitter having a conductivity type that is opposite to that of the second emitter is inserted into the first base layer. The first electrode includes an electrode that contacts the first emitter and the first base layer and the second electrode contacts the second emitter of the thyristor.

In an embodiment, the electrode that contacts the first emitter and the first base layer includes two parts: the first part being composed of polycrystalline silicon and contacts the second sub-region of the first base layer; and the second part includes a conductive coating that overlaps the first part at the side edge thereof.

In an embodiment the semiconductor component is characterized by a dynamically balanced format, whereby the first electrode comprises a circular lateral limitation.

In another embodiment, the semiconductor is characterized by a dynamically balanced format, whereby the first electrode contacting the first emitter and the first base layer comprise an annular lateral limitation. An ignition electrode contacting the first base layer is located in a central recess of the ignition electrode.

An advantage obtainable with the present invention is that a reduced breakdown voltage at which the pn junction of the semiconductor component breaks down without the semiconductor component suffering damage, can be set with adequate precision and reproducibility.

Additional features and advantages of the present invention will be described in, and are apparent from, the detailed description of the presently preferred embodiments and from the drawings.

DETAILED DESCRIPTION OF THE PRESENTLY PREFERRED EMBODIMENTS

The present invention provides a semiconductor component constructed so that the pn junction breaks down in a defined way when a reduced voltage is attained, without the thermal destruction of the component occurring.

To accomplish this, a semiconductor component is provided that comprises a planar pn junction whereby a semiconductor region having a second conductivity type is provided at a boundary surface of a doped semiconductor member having a first conductivity type. A first sub-region of the semiconductor region is bounded by a part of the pn junction that extends substantially parallel to the boundary surface. A second sub-region is separated from the remaining part of the semiconductor member by a part of the pn junction that approaches the boundary surface and laterally limits the semiconductor region in the boundary surface. The doping concentration of the second sub-region is dimensioned so that it is lower than that of the first sub-region. The semiconductor region and the semiconductor member are each respectively contacted by a first and second electrode. The edge of the first electrode contacts the second sub-region and this edge is brought toward the lateral limitation of the semiconductor region that lies in boundary surface to such an extent that, given the application of a voltage inhibiting the pn junction, the space charge zone being formed at the pn junction has its edge lying in the boundary surface just reaching the first electrode, given a reduced breakdown voltage.

Figure 1:
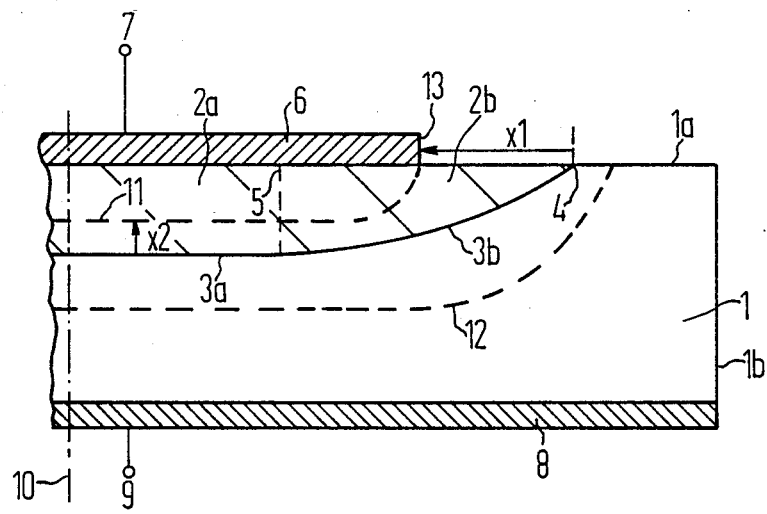
FIG. 1 illustrates a cross-sectional view of a power diode constructed pursuant to the present invention.

FIG. 1 illustrates a cross-sectional view of a semiconductor member 1. The semiconductor member 1, can be, of, for example, an n-doped silicon, having a doping concentration of $10^{14} cm^{-3}$ into which a p-conductive semiconductor region 2a, 2b is inserted. The p-conductive semiconductor region 2b is separated from the remaining part of the semiconductor member 1 by a planar pn junction 3a, 3b.

A first sub-region 2a of the semiconductor region is bounded by a central part 3a of the pn junction that extends substanially parallel to the boundary surface 1a of the semiconductor member. A second sub-region 2b is bounded by a further part 3b of the pn junction. The part 3b of the pn junction thereby adjoins the central part 3a of the pn junction and gradually approaches the boundary surface 1a during its further course, reaching the boundary surface 1a at a line 4 that represents the lateral limitation of the semiconductor region 2a, 2b in the boundary surface 1a.

Boron can be used as a dopant for the semiconductor region 2a, 2b. The doping concentration in the sub-region 2a can be, for example, $10^{18} cm^{-3}$. The doping concentration in the sub-region 2b, can for example, proceed from a value of above $10^{18} cm^{-3}$, that is present at the boundary of the sub-region 2a referenced by line 5, and constantly diminishes in a direction toward the lateral limitation 4. The doping concentration ultimately reaches a value of approximately $10^{14} cm^{-3}$ to about $10^{12} cm^{-3}$ and below at the limitation 4.

The semiconductor region 2a, 2b is contacted by an electrode 6 that is provided with a terminal 7. On the other side thereof, the semiconductor member is provided with an electrode 8 that includes a terminal 9.

When the parts 1, 2a, 2b, 6, and 8 are constructed so as to be dynamically balanced, the dot-line 10 of FIG. 1, represents the symmetry axis. In this case, the lateral limitation 4 of the semiconductor region 2a, 2b and the edge area of the semiconductor 1 is contructed in a circular manner or, respectively, as a cylindrical generated surface. The manufacture of such a semiconductor component is disclosed in detail in European Patent Application No. EP-A-0 176 778.

When the terminals 7 and 9 are wired with a voltage that places the semiconductor member 1 at a more positive potential than the semiconductor region 2a, 2b, then the pn junction 3a, 3b is biased in a non-conducting direction. A space charge zone whose boundaries are referenced by numerals 11 and 12 thereby forms thereat. Due to the low doping concentration of the sub-region 2b, in comparison to the sub-region 2a, the boundary 11 of the space charge zone in the boundary surface 1a penetrates into the sub-region 2b through a path, represented by x1 given an increase of the inhibiting bias of the pn junction 3a, 3b to a value Ux. In contrast, the boundary 11 above the central part 3a of the pn junction advances merely by an amount, represented by $\times 2$ that is only approximately one-third of $\times 1$. When the lateral expanse of the electrode 6 is such that its edge 13, first, contacts the sub-region 2b and, then approaches the lateral limitation 4 to such and extent that it boundary 11 just matches it, when an inhibit voltage Ux is reached, then a controlled breakdown of the pn junction 3a, 3b occurs given the application of Ux. Ux is thus unambiguously defined as a reduced breakdown voltage.

The controlled breakdown of 3a, 3b occurring given an advance of the boundary 11 of the space charge zone up to the edge 13 of the electrode 6 occurs given a breakdown voltage Ux that is reduced to such an extent that the semiconductor component is not thermally overloaded or, respectively, destroyed by the breakdown current that thereby flows. If the electrode 6 was not so dimensioned in the lateral direction, i.e., for example, given a lateral expanse of the electrode 6 that did not laterally project beyond the sub-region 2a, a breakdown of the pn junction 3a, 3b would ensue at a higher breakdown voltage Uy, and this would lead to an uncontrollable, local breakdown of the part 3b of the pn junction in the boundary region of the parts 3a and 3b . Such an uncontrollable breakdown, would typically lead to the destruction of the component.

An inventively produced, controlled breakdown of a planar pn junction, i.e., the pn junction laterally limited in the boundary surface 1a, is also achieved when the penetration depth of the sub-region 2b, differing from that illustrated in FIG. 1, does not gradually decrease in a direction toward the limitation 4, but, rather is essentially constant, whereby the pn junction approaches the lateral limitation 4 in a steep rise or, respectively, in a vertical direction in the immediate region of the lateral limitation 4. A prerequisite, however, is that the doping concentration of the sub-region 2b is lower than the doping concentration of the sub-region 2b, whereby a uniform doping course in the sub-region 2b is also allowable in the lateral direction.

Figure 2:
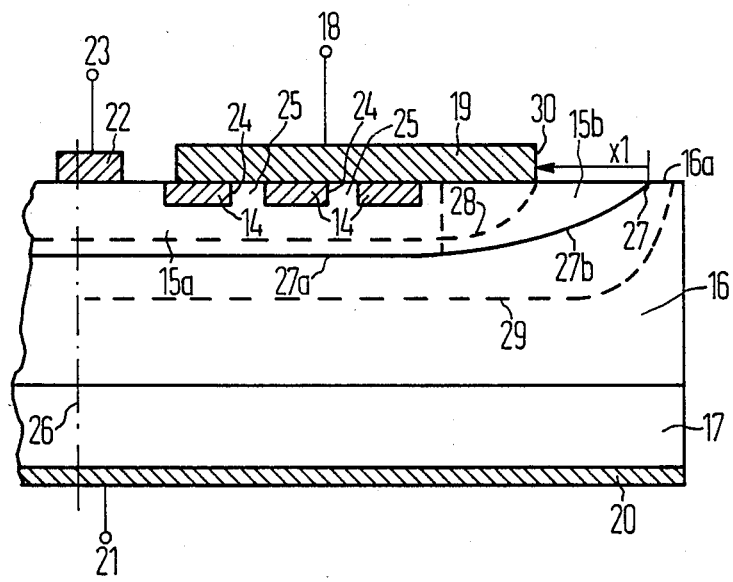
FIG. 2 illustrates a cross-sectional view of a power thyristor constructed pursuant to the present invention.

FIG. 2 illustrates a power thyristor constructed pursuant to the present invention. The power thyristor includes: an n-emitter 14; a p-base 15a, 15b; an n-base 16; and a p-emitter 17. The n-emitter 14 is contacted by an electrode 19 at the cathode side. The electrode 19 includes a terminal 18. The p-emitter 17 is contacted by an electrode 20 at the anode side. The electrode 20 includes a terminal 21. A trigger electrode 22 contacts the p-base 15a. The trigger electrode 22 includes a trigger 23 that is supplied with a positive voltage pulse in order to ignite the thyristor. Recesses 24 of the n-emitter 14 are provided that are filled out with corresponding projections 25 of the p-base. The latter are contacted in the boundary surface 16a by the electrode 19 at the cathode side.

The structure parts 24 and 25 form emitter-base shorts that prevent an undesired ignition of the thyristor given the application of blocking voltages that place the terminal 21 at a more positive potential than the terminal 18. Given a dynamically balanced format of the thyrsitor, the dot-dash line 26 represents the symmetry axis. A pn junction 27a, 27b that is biased in a non-conducting direction, given the application of a blocking voltage to the terminals 18 and 21, is located between the p-base 15a, 15b and the n-base 16. When the inhibit voltage adjacent at 27a, 27b is elevated to the value of the breakdown voltage Uy, then the local breakdown of the pn junction 27a, 27b that then arises leads to an uncontrollable ignition of the thyristor that can thermally destroy it.

In order to eliminate this risk, the parts 15a and 15b, 27a and 27b, and 16 and 19 are constructed similarly to parts 2a and 2b, 3a and 3b, and 1 and 6 illustrated in FIG. 1. The first sub-region 15a of the p-base is more highly doped than the second sub-region 15b thereof and the second sub-region 15b is laterally limited by a limitation 27 in the boundary surface of the thyristor. The electrode 19 at the cathode side is lengthened to such an extent, in the direction toward the lateral limitation 27, that it contacts the sub-region 15b and such that the boundary 28 of the space charge zone is built up at the inhibited pn junction 27a, 27b. The lower boundary of the space-charge zone, referenced by numeral 29, extends into the sub-region 15b by exactly the distance ×1 when a reduced breakdown voltage Ux is reached, so that the boundary 28 just reaches the edge 30 of the electrode 19. A controlled breakdown thus occurs at the pn junction 27a, 27b. This breakdown represents a precipitous ignition of the thyristor, but does not lead to a destruction of same because of the reduced breakdown voltage Ux. Without the planar structuring of the pn junction 27a, 27b that has been set forth above, and without the dimensioning of the electrode 19 and the relatively low doping of the sub-region 15b in comparison to the sub-region 15a, an uncontrollable breakdown of the pn junction 27a, 27b, that could destroy the thyristor, would ensue given a breakdown voltage Uy that is greater than Ux.

Figure 3:
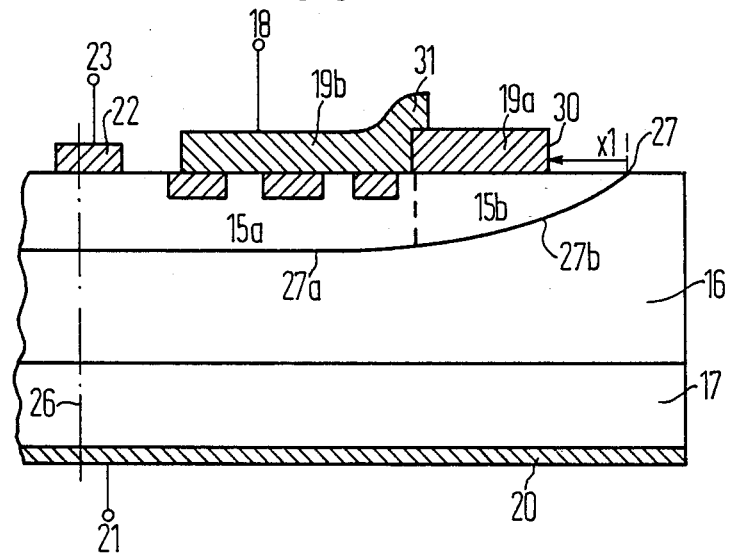
FIG. 3 illustrates a cross-sectional view of a modification of the thyristor illustrated in FIG. 2.

FIG. 3 illustrates another embodiment of the thyristor of the present invention and specifically of the thyristor illustrated in FIG. 2. In the embodiment of the thyristor illustrated in FIG. 3, the electrode at the cathode side, whose lateral expanse completely corresponds to that of the electrode 19 of FIG. 2, is composed of a first part 19a and of a second part 19b. The first part 19a is composed of a layer of polycrystalline silicon. The outer edge of the first part 19a is referenced by numeral 30 in accord with FIG. 2. The second part 19b is composed of a conductive coating of, for example, aluminum that is applied after the application of the part 19a and slightly overlaps the latter at 31.

Pursuant to this embodiment of the present invention, the current leading to the controlled breakdown of the pn junction 27a, 27b and flowing via the parts 21, 20, 17, 16, and 15b into the part 19a and from the latter into the parts 19b and 18, is limited by the resistance of the polycrystalline silicon. Thus, an excessively greater thermal load, even given an ignition of the thyristor that proceeds relatively slowly, is not produced.

Instead of the afore-mentioned dynamically balanced fashioning of the semiconductor components illustrated in the drawing, the semiconductor member 1 and the semiconductor region 2a, 2b or the parts 14, 15a, 15b, 16 and 17 can also comprise lateral limitations deviating therefrom, for example rectangular lateral limitations. The same is true of the electrodes 6, 8, 19, 19a and 19b.

Within the framework of the present invention, the electrode 6 of the component illustrated in FIG. 1 can also be composed of a first and of a second part in accord with the electrode 19a, 19b in FIG. 3, whereby the first part is composed of polycrystalline silicon and the second part is formed by a conductive coating of, for example, aluminum.

It should be understood that various changes and modifications to the presently preferred embodiments described herein will be apparent to those skilled in the art. Such changes and modifications can be made without departing from the spirit and scope of the present invention and without diminishing its attendant advantages. It is therefore intended that such changes and modifications be covered by the appended claims.

We claim:

1. A semiconductor component comprising a planar pn junction whereby a semiconductor region having a second conductivity type is provided at a boundary surface of a doped semiconductor member having a first conductivity type, a first sub-region of said semiconductor region being bounded by a part of the pn junction extending roughly parallel to the boundary surface and a second sub-region of said semiconductor region is separated from a remaining part of the semiconductor member by a part of the pn junction that approaches the boundary surface and laterally limits the semiconductor region in the boundary surface and laterally limits the semiconductor region in the boundary surface, the doping concentration of the second sub-region being lower than that of the first sub-region and the semiconductor region and the semiconductor member are each respectively contacted by a first and second electrode, the edge of the first electrode contacts the second sub-region and this edge is brought toward the lateral limitation of the semiconductor region that lies in the boundary surface to such an extent that, given the application of a voltage inhibiting the pn junction that the space charge zone being formed at the pn junction has its edge lying in the boundary surface just reaching the first electrode given a reduced breakdown voltage.

2. The semiconductor component of claim 1 wherein the doping concentration of the second sub-region decreases in a direction toward the lateral limitation of the semiconductor region proceeding from a doping concentration that is present at the boundary to the first sub-region.

3. The semiconductor component of claim 1 wherein the semiconductor region is composed of a first base layer of a thyristor, the semiconductor member is formed of a second base layer and of a second emitter adjacent thereto in the thyristor, a first emitter is provided having a conductivity type that is opposite to that of the second emitter and is inserted into the first base layer, the first electrode including an electrode contacting the first emitter and the first base layer, and the second electrode contacts the second emitter of the thyristor.

4. A semiconductor component comprising a planar pn junction whereby a semiconductor region having a second conductivity type is provided at a boundary surface of a doped semiconductor member having a first conductivity type, a first sub-region of said semiconductor region being bounded by a part of the pn junction extending roughly parallel to the boundary surface and a second sub-region of said semiconductor region is separated from a remaining part of the semiconductor member by a part of the pn junction that approaches the boundary surface and laterally limits the semiconductor region in the boundary surface, the doping concentration of the second sub-region being lower than that of the first sub-region and the semiconductor region and the semiconductor member are each respectively contacted by a first and second electrode, the edge of the first electrode contacts the second sub-region and this edge is brought toward the lateral limitation of the semiconductor region that lies in the boundary surface to such an extent that, given the application of a voltage inhibiting the pn junction that the space charge zone being formed at the pn junction has its edge lying in the boundary surface just reaching the first electrode given a reduced breakdown voltage, the semiconductor region is composed of a first base layer of a thyristor, the semiconductor member is formed of a second base layer and of a second emitter adjacent thereto in the thyristor, a first emitter is provided having a conductivity type that is opposite to that of the second emitter and is inserted into the first base layer, the first electrode including an electrode contacting the first emitter and the first base layer, and the second electrode contacts the second emitter of the thyristor, the electrode contacting the first emitter and the first base layer includes two parts, a first part being constructed from polycrystalline silicon and contacts the second sub-region of the first base layer and a second part includes a conductive coating that overlaps the first part at the edge side thereof.

5. The semiconductor component of claim 1 having a dynamically balanced format, the first electrode including a circular lateral limitation.

6. The semiconductor component of claim 3 having a dynamically balanced format, the electrode contacting the first emitter and the first base layer includes an annular lateral limitation and an ignition electrode contacting the first base layer is located in a central recess of this electrode.

7. A semiconductor comprising a planar pn junction whereby a semiconductor region having a second conductivity type is provided at a boundary surface of a doped semiconductor member having a first conductivity type, a first sub-region of said semiconductor region being bounded by a part of the pn junction extending roughly parallel to the boundary surface and a second sub-region of said semiconductor region is separated from a remaining part of the semiconductor member by a part of the pn junction that approaches the boundary surface and laterally limits the semiconductor region in the boundary surface, the doping concentration of the second sub-region being lower than that of the first sub-region and the semiconductor region and the semiconductor member are each respectively contacted by a first and second electrode, the edge of the first electrode contacts the second sub-region and this edge is brought toward the lateral limitation of the semiconductor region that lies in the boundary surface to such an extent that, given the application of a voltage inhibiting the pn junction that the space charge zone being formed at the pn junction has its edge lying in the boundary surface just reaching the first electrode given a reduced breakdown voltage, the doping concentration of the second sub-region decreases in a direction toward the lateral limitation of the semiconductor region proceeding from a doping concentration that is present at the boundary to the first sub-region, the semiconductor region is composed of a first base layer of a thyristor, the semiconductor member is formed of a second base layer and of a second emitter adjacent thereto in the thyristor, a first emitter having a conductivity type that is opposite to that of the second emitter is inserted into the first base layer, the first electrode being composed of an electrode contacting the first emitter and the first base layer, and the second electrode contacts the second emitter of the thyristor.

8. The semiconductor component of claim 7, wherein the electrode contacting the first emitter and the first base layer includes two parts, a first part constructed from polycrystalline silicon and contacts the second sub-region of the first base layer and a second part includes a conductive coating that overlaps the first part a the edge side thereof.

9. The semiconductor component of claim 2, having a dynamically balanced format, the first electrode including a circular lateral limitation.

10. The semiconductor component of claim 4, having a dynamically balanced format, the electrode contacting the first emitter and the first base layer includes an annular lateral limitation, and an ignition electrode contacting the first base layer is located in a central recess of this electrode.

11. A semiconductor component comprising:
a planar- pn junction wherein a semiconductor region having a second conductivity type is provided at a boundary surface of a doped semiconductor member having a first conductivity type:
the semiconductor including a first region sub-region that is bounded by a part of the pn junction that extends roughly parallel to the boundary surface, and a second sub-region that is separated from the remaining part of the semiconductor member by a part of the pn junction that extends towards the boundary surface and laterally limits the semiconductor region in the boundary surface:
the second sub-region including a doping concentration that is lower than a doping concentration the first sub-region;
the semiconductor region and the semiconductor member are each respectively contacted by a first and second electrode, the edge of the first electrode contacts the second sub-region and extends towards the lateral limitation of the semiconductor region that lies in the boundary surface and is so constructed and arranged that, given application of a voltage inhibitng the pn junction that the space charge zone being formed at the pn junction has its edge lying in the boundary surface just reaching the first electrode given a reduced breakdown voltage.

12. The semiconductor component of claim 11 wherein the doping concentration of the second sub-region decreases in a direction toward the lateral limitation of the semiconductor region.

13. The semiconductor component of claim 12 wherein the doping concentration in the second sub-region decreases from a concentration that is approximately equal to that present at the boundary of the first sub-region.

14. The semiconductor component of claim 11 wherein the semiconductor region is composed of a first base layer of a thyristor, the semiconductor member is formed of a second base layer and of a second emitter adjacent thereto in the thyristor, a first emitter is provided having a conductivity type that is opposite to that of the second emitter and is inserted into the first base layer, the first electrode including an electrode contacting the first emitter and the first base layer, and the second electrode contacts the second emitter of the thyristor.

15. A semiconductor component comprising:

a planar pn junction wherein a semiconductor region having a second conductivity type is provided at a boundary surface of a doped semiconductor member having a first conductivity type;

the semiconductor including a first region sub-region that is bounded by a part of the pn junction that extends roughly parallel to the boundary surface, and a second sub-region that is separated from the remaining part of the semiconductor member by a part of the pn junction that extends towards the boundary surface and laterally limits the semiconductor region in the boundary surface;

the second sub-region including a doping concentration that is lower than a doping concentration the first sub-region;

the semiconductor region and the semiconductor member are each respectively contacted by a first and second electrode, the edge of the first electrode contacts the second sub-region and extends towards the lateral limitation of the semiconductor region that lies in the boundary surface and is so constructed and arranged that, given application of a voltage inhibiting the pn junction that the space charge zone being formed at the pn junction has its edge lying in the boundary surface just reaching the first electrode given a reduced breakdown voltage;

the doping concentration in the second sub-region decreases from a concentration that is approximately equal to that present at the boundary of the first sub-region; and wherein the electrode contacting a first emitter and a first base layer includes two parts, a first part being constructed from polycrystalline silicon and contacts the second sub-region of the first base layer and a second part includes a conductive coating that overlaps the first part at the edge side thereof.

16. The semiconductor component of claim 11 having a dynamically balanced format, the first electrode including a circular lateral limitation.

17. The semiconductor component of claim 13 having a dynamically balanced format, the electrode contacting a first emitter and a first base layer includes an annular lateral limitation and an ignition electrode contacting the first base layer is located in a central recess of this electrode.

* * * * *